United States Patent
Ahlstedt et al.

(10) Patent No.: US 9,164,354 B2
(45) Date of Patent: Oct. 20, 2015

(54) CONVERSION COMPONENT

(75) Inventors: Mikael Ahlstedt, Munich (DE); Ute Liepold, Munich (DE); Carsten Schuh, Baldham (DE); Gia Khanh Pham, Charlotte, NC (US)

(73) Assignee: OSRAM Opto Semiconductors GmbH, Regensburg (DE)

( * ) Notice: Subject to any disclaimer, the term of this patent is extended or adjusted under 35 U.S.C. 154(b) by 80 days.

(21) Appl. No.: 13/878,170

(22) PCT Filed: Oct. 10, 2011

(86) PCT No.: PCT/EP2011/067658
§ 371 (c)(1),
(2), (4) Date: Jun. 11, 2013

(87) PCT Pub. No.: WO2012/049129
PCT Pub. Date: Apr. 19, 2012

(65) Prior Publication Data
US 2014/0001503 A1 Jan. 2, 2014

(30) Foreign Application Priority Data
Oct. 11, 2010 (DE) .......................... 10 2010 048 162

(51) Int. Cl.
*G02F 2/02* (2006.01)
*H01L 33/46* (2010.01)
*H01L 33/50* (2010.01)
*H01L 33/56* (2010.01)

(52) U.S. Cl.
CPC *G02F 2/02* (2013.01); *H01L 33/46* (2013.01); *H01L 33/50* (2013.01); *H01L 33/56* (2013.01); *H01L 2924/0002* (2013.01)

(58) Field of Classification Search
None
See application file for complete search history.

(56) References Cited

U.S. PATENT DOCUMENTS

| | | | |
|---|---|---|---|
| 2007/0237479 A1* | 10/2007 | Seol et al. | 385/129 |
| 2008/0315228 A1 | 12/2008 | Krames et al. | |
| 2009/0116209 A1* | 5/2009 | Engl et al. | 361/818 |
| 2010/0067233 A1* | 3/2010 | Bechtel et al. | 362/260 |
| 2010/0073907 A1 | 3/2010 | Wanninger et al. | |
| 2010/0277887 A1* | 11/2010 | Su et al. | 362/19 |
| 2010/0320479 A1 | 12/2010 | Minato et al. | |
| 2011/0049555 A1* | 3/2011 | Engl et al. | 257/98 |

FOREIGN PATENT DOCUMENTS

| | | |
|---|---|---|
| CN | 101222008 A | 7/2008 |
| DE | 10 2004 002 101 A1 | 5/2005 |

(Continued)

*Primary Examiner* — Daniel Luke
(74) *Attorney, Agent, or Firm* — Slater & Matsil, L.L.P.

(57) ABSTRACT

A conversion component for arrangement downstream at a radiation-outcoupling face of a radiation-emitting semiconductor chip is specified. The component has a converter element with a first major face, a second major face opposite the first major face and at least one side face. The side face connects together the two major faces. The converter element contains at least one luminescence conversion material, which is suitable for absorbing electromagnetic radiation of one wavelength range and for re-emitting the absorbed electromagnetic radiation in another wavelength range with larger wavelengths than the absorbed radiation. A reflective coating is designed to reflect electromagnetic radiation exiting from the converter element and to reflect it at least in part back into the converter element. The reflective coating covers the converter element at least in places at the at least one side face.

12 Claims, 2 Drawing Sheets

(56) References Cited

FOREIGN PATENT DOCUMENTS

| | | |
|---|---|---|
| DE | 10 2004 053 116 A1 | 5/2006 |
| DE | 10 2007 029 369 A1 | 1/2009 |
| DE | 10 2009 058 006 A1 | 6/2011 |
| EP | 2 216 834 A1 | 8/2010 |
| KR | 1020090034966 A | 4/2009 |
| KR | 1020100052935 A | 5/2010 |
| KR | 1020100091992 A | 8/2010 |
| WO | 2008014771 A1 | 2/2008 |
| WO | WO 2008/056292 A1 | 5/2008 |
| WO | WO 2009/115998 A2 | 9/2009 |
| WO | WO 2010/106478 A1 | 9/2010 |
| WO | WO 2012/062758 A1 | 5/2012 |

\* cited by examiner

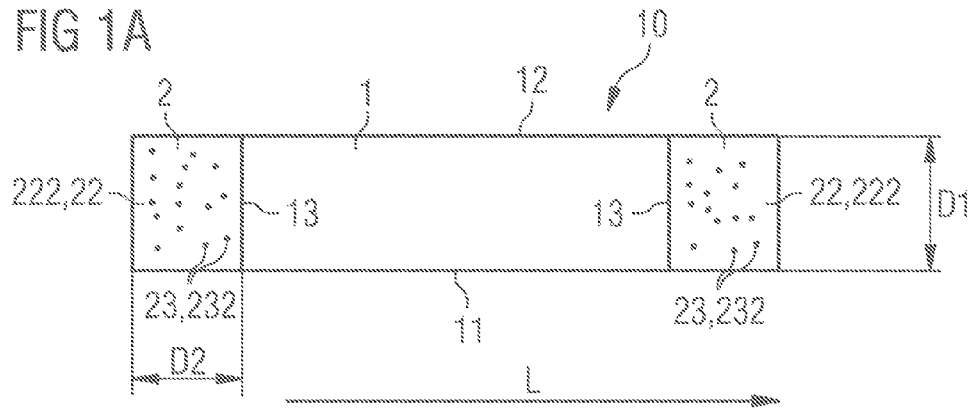
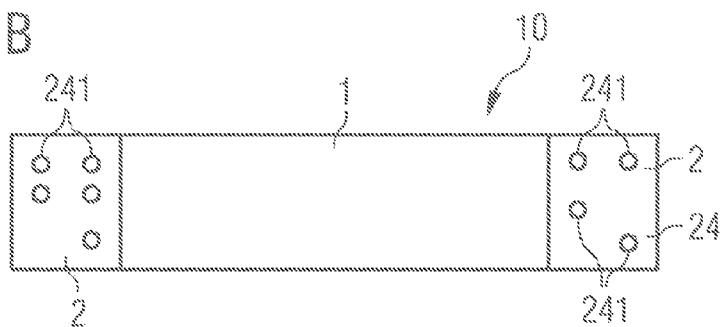
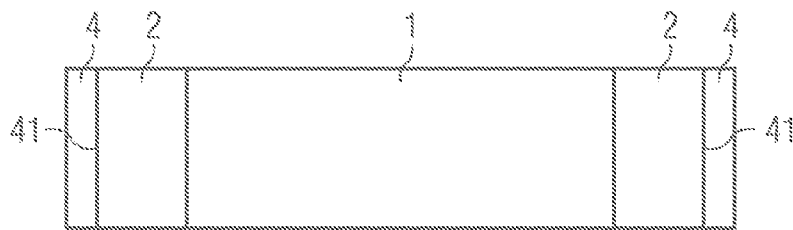
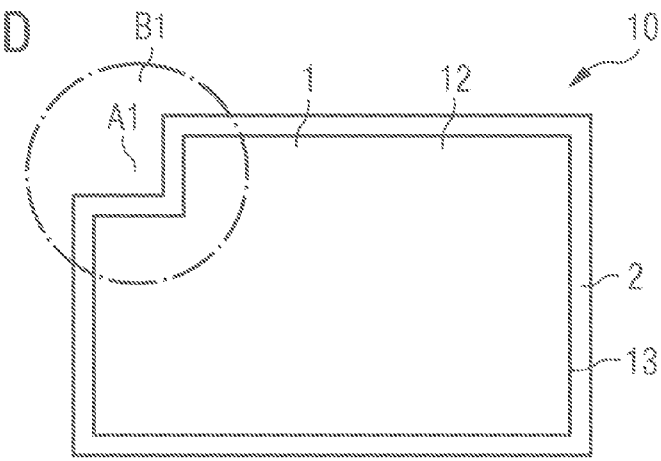

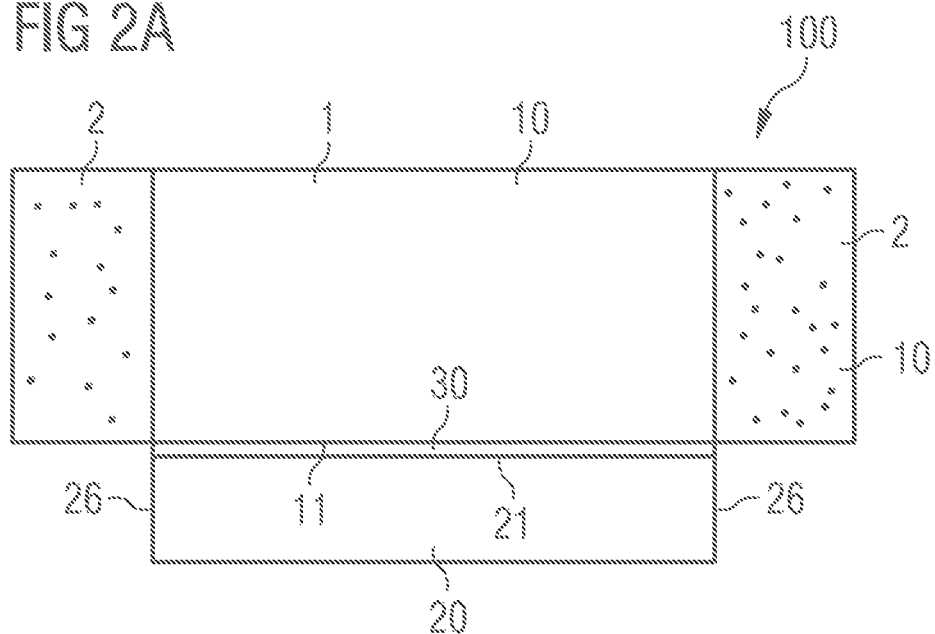
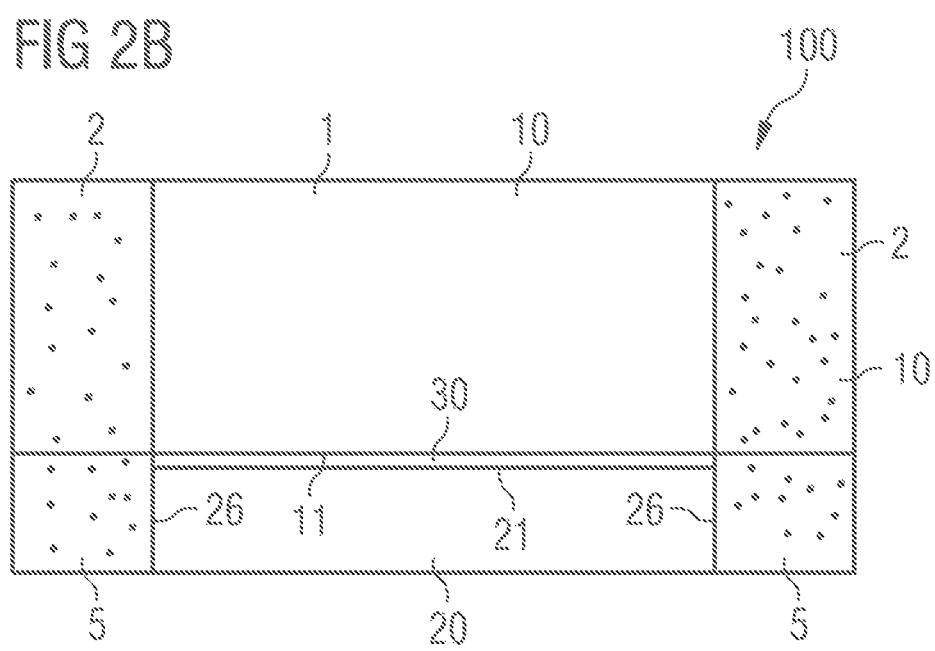

CONVERSION COMPONENT

This patent application is a national phase filing under section 371 of PCT/EP2011/067658, filed Oct. 10, 2011, which claims the priority of German patent application 10 2010 048 162.9, filed Oct. 11, 2010, each of which is incorporated herein by reference in its entirety.

TECHNICAL FIELD

A conversion component and a semiconductor device having such a conversion component are specified.

SUMMARY OF THE INVENTION

In one aspect, a conversion component comprises improved conversion properties.

According to at least one embodiment, the conversion component is suitable for being arranged downstream at a radiation-outcoupling face of a radiation-emitting semiconductor chip. The conversion component may be used in a semiconductor device, for example. By way of example, such a semiconductor device comprises the radiation-emitting semiconductor chip. The conversion component may be arranged downstream of the radiation-emitting semiconductor chip in the main emission direction thereof at the radiation-outcoupling face. The conversion component preferably converts electromagnetic radiation of one wavelength range emitted by the semiconductor chip into electromagnetic radiation of another wavelength range.

According to at least one embodiment of the conversion component, the latter comprises a converter element, which comprises a first major face, a second major face opposite the first major face and at least one side face. The side face connects the two major faces together. The side face extends for example perpendicular to a main direction of extension of the converter element and may thus also extend transversely of the two major faces. The side face thus defines the converter element laterally.

The first major face is, for example, the part of the outer faces of the converter element which faces the radiation-outcoupling face of the radiation-emitting semiconductor chip in the mounted state. The first major face of the converter element is, for example, a mounting face, which may serve to mount the conversion component on or at the radiation-outcoupling face of the radiation-emitting semiconductor chip.

According to at least one embodiment, the converter element contains at least one luminescence conversion material which is suitable for absorbing electromagnetic radiation of one wavelength range and re-emitting the absorbed electromagnetic radiation in another wavelength range with larger wavelengths than the absorbed radiation. The luminescence conversion material for example converts blue light entering into the converter element via the first major face of the converter element in part into yellow light, which may then mix together with the blue light to yield white light.

According to at least one embodiment, the conversion component comprises a reflective coating, which is designed to reflect electromagnetic radiation exiting the converter element and to reflect it at least in part back into the converter element. In this context, "reflective" means that the coating reflects at least 70%, preferably more than 80%, of the electromagnetic radiation exiting from the converter element and impinging on said coating.

According to at least one embodiment of the conversion component, the reflective coating covers the converter element at least in places at the at least one side face. "At least in places" may here mean that the reflective coating completely covers the side face of the converter element only in predeterminable places and in other places covers it only to a certain level and/or not at all. In other words, the converter element may in some places still project partially out of the reflective coating and in other places be completely covered by the reflective coating. In addition, the reflective coating may completely cover the at least one side face. The side face is, for example, in direct contact with the reflective coating at the covered points of the converter element. In other words, there is preferably neither a gap nor an interruption between the reflective coating and the side face of the converter element. It is possible, in particular, for the reflective coating to terminate flush with the side face of the converter element.

According to at least one embodiment of the conversion component, the two major faces of the converter element are free of the reflective coating at least in places. In this context, "free" means that the first and/or second major face each comprise at least one face region which is not covered by the reflective coating and the reflective coating is not arranged vertically downstream of these face regions. "Vertical direction" is in this case a direction perpendicular to the main direction of extension of the converter element. Electromagnetic radiation may then be coupled unhindered in or out of the converter element via these face regions, for example, the entire area of the first and second major faces.

According to at least one embodiment of the conversion component, which is suitable for arrangement at a radiation-outcoupling face of a radiation-emitting semiconductor chip, said semiconductor chip comprises at least one converter element which comprises a first major face, a second major face opposite the first major face and at least one side face. The side face connects the two major faces together. In addition, the converter element contains at least one luminescence conversion material, which is suitable for absorbing electromagnetic radiation of one wavelength range and for emitting the absorbed electromagnetic radiation in another wavelength range. Moreover, the conversion component comprises a reflective coating, which is designed to reflect electromagnetic radiation exiting from the converter element and to reflect it at least in part back into the converter element. The reflective coating completely covers the converter element at least in places at the at least one side face, wherein the two major faces of the converter element are free of the reflective coating at least in places.

"For arrangement downstream" means in the present context in particular that the conversion component is self-supporting and pre-manufactured. In other words, the conversion component is an independent component which is manufactured independently of the semiconductor chip, downstream of which it is to be arranged. In particular, the reflective coating of the conversion component is produced independently of any reflective coating of the semiconductor chip which may possibly be present.

The conversion component described herein is based inter alia on the recognition that the exit of electromagnetic radiation converted at least in part within a converter element via side faces of the converter element, instead of via a major face of the converter element, may lead to undesired color location non-uniformities and/or shifts of the electromagnetic radiation exiting from the converter element, if all the radiation exiting from the converter element is to be utilized. Such color location non-uniformities may be attributed substantially to the fact that electromagnetic radiation exiting from the side faces travels a shorter distance within the converter element to the point of outcoupling from the converter element than electromagnetic radiation outcoupled via the major face of the converter element. In other words, the undesired electromagnetic radiation exiting from the side face may exhibit a different degree of color conversion and thus a different color location from the desired electromagnetic radiation coupled out via the major face. If, in addition to the electromagnetic radiation exiting from the major face, the electromagnetic radiation exiting from the side faces of the converter element is now likewise utilized, for example, by way of reflective optical systems arranged to the side of the converter element, the electromagnetic radiation exiting via the side face and via the major face of the converter element may be mixed together by these reflective optical systems, so shifting the color location of the electromagnetic radiation which has exited overall from the converter element.

In addition, outcoupling losses may arise in semiconductor components comprising such a converter element, since the electromagnetic radiation exiting from the converter element via the side face impinges, for example, on a housing body arranged to the side of the converter element and may be absorbed thereby.

According to at least one embodiment, the mode of operation of a conversion component described herein is as follows. At least some of the radiation coupled into the converter element is converted within the converter element, independently of direction, by the luminescence conversion material contained in the converter element and then re-emitted by said converter element. "Independently of direction" means that when electromagnetic radiation converted in the converter element is re-emitted within the converter element by the luminescence conversion material, this is not done in any preferential direction.

After conversion of the electromagnetic radiation within the converter element, some of the converted radiation is re-emitted towards the side faces of the converter element and then exits from the converter element via the side faces of the converter element. This fraction of the radiation then impinges at least in part on the reflective coating, which is designed to reflect electromagnetic radiation exiting from the converter element, and to reflect it at least partially back into the converter element. At least some of this radiation reflected back into the converter element is guided away from the first major face and may then be coupled out of the converter element via the second major face and thus out of the conversion component. If some of the radiation reflected back into the converter element is reflected back for example towards the first major face, the reflection process may be repeated several times. It is feasible for the reflection process to be repeated until the corresponding fraction of the radiation is coupled out of the converter element and thus out of the conversion component. In other words, the electromagnetic radiation coupled out of the converter element is composed of the direct radiation fraction, i.e., the radiation fraction which is coupled out of the converter element without prior reflection at the reflective coating, and the radiation fraction which is reflected back into the converter element through at least one unique (back)-reflection at the reflective coating, and is coupled out of the conversion component through the second major face of the converter element.

The reflective coating described herein advantageously enables, inter alia, a color location to be made uniform along the second major face of the converter element. The conversion component described here makes it possible to provide a semiconductor components, for example, to do without complex reflective optical systems arranged for example to the side of the conversion component, which optical systems reflect the electromagnetic radiation exiting from the side faces of the converter element towards the second major face. Such semiconductor components may be particularly compact and simple in structure.

According to at least one embodiment, the reflective coating does not project beyond the converter element at the sides. It is feasible for the reflective coating to terminate flush both with the first and with the second major face of the converter element in the vertical direction. The reflective coating then envelops the side faces of the converter element, for example, completely, whereby the radiation fraction reflected back into the converter element by the reflective coating is as large as possible. Electromagnetic radiation can only pass through the converter element at the points intended therefor, i.e., can only be coupled into the converter element via the first major face, and leave it again via the second major face. The reflective coating therefore contributes to the particularly effective conversion of electromagnetic radiation.

According to at least one embodiment, the converter element is formed with a ceramic material. To this end, the luminescence conversion material may be embedded in a matrix material, for example, a vitreous ceramic or a ceramic. The converter element then takes the form of a plate, for example. It is likewise possible for the converter element to consist completely of a ceramic luminescence conversion material. The converter element may then be a plate of such a ceramic luminescence conversion material.

According to at least one embodiment, the reflective coating comprises a base material, which is formed with at least one of the following materials: ceramic material, vitreous material, organic material, plastics material, semiconductor material.

According to at least one embodiment, radiation-reflecting particles are introduced into the base material, an optical refractive index of the radiation-reflecting particles being greater than an optical refractive index of the base material. The optical refractive index of the radiation-reflecting particles is for example at least 1.8. Such a refractive index range of the radiation-reflecting particles has proven particularly advantageous with regard to the radiation-reflecting properties of the reflective coating.

According to at least one embodiment, the radiation-reflecting particles are formed with or contain at least one of the following materials: $TiO_2$, $ZrO_2$, $ZnO$, $Al_2O_3$, $BaSO_4$, $MgO$, $Ta_2O_5$, $HfO_2$, $Gd_2O_3$, $Nb_2O_3$, $Y_2O_3$. Such particles have proven very particularly suitable for reflecting electromagnetic radiation impinging thereon.

According to at least one embodiment, the concentration of radiation-reflecting particles in the base material is at least 10 vol. %. The radiation-reflecting particles are distributed uniformly within the base material, for example. Due to the reflective properties of the reflective coating, the reflective coating appears white to an external observer, for example, since the entire incident color spectrum of the ambient light is preferably reflected by the reflective coating. It is however likewise possible for the reflective coating to appear differently colored to an external observer. The reflective coating has a thickness of from at least 50 µm to at most 300 µm. "Thickness" is the maximum extent of the reflective coating, for example, in a direction perpendicular to the side faces of the converter element.

According to at least one embodiment, the reflective coating is formed with a metallic material. The metallic material is, for example, Ag and/or Al. Such a reflective coating is advantageously opaque to electromagnetic radiation impinging thereon, i.e., exiting from the converter element. In this case, the reflective coating has a thickness of from at least 100 nm to at most 1 µm.

According to at least one embodiment, the reflective coating is formed with at least one photonic crystal, wherein the photonic crystal is formed with at least one one-, two- and/or three-dimensional photonic band gap structure. "One-dimensional" may mean that the photonic crystal takes the form of a layer (also 1D layer structure). "Two-dimensional" may mean that the photonic crystal may take the form of tubes or small rods (also 2D rod structure). Accordingly, "three-dimensional" may mean that the photonic crystal is formed with spherical structures (also 3D sphere structure). The photonic crystal is formed, for example, with at least two materials which differ, for example, with regard to their respective optical reflection coefficients. The at least two different materials may be arranged periodically alternately and in succession along a pre-determinable (preferential) direction. The band gap position of the photonic crystal may depend on the lattice constant, formed by the different materials, of the photonic crystal, wherein the size of the band gap of the photonic crystal may be determined by a ratio of the reflection coefficients of the two different, periodically arranged materials. In other words, the reflectivity may be adjusted by means of the photonic crystal and the different materials used therein.

According to at least one embodiment of the conversion component, the photonic crystal comprises pores, the photonic crystal being formed with a ceramic material and/or a vitreous material. Such a photonic crystal is, for example, formed by at least one three-dimensional photonic band gap structure. The pores are, for example, completely enclosed by the ceramic and/or vitreous material and filled with air, for example. The ceramic material is formed, for example, with at least one of the materials $SiO_2$, $TiO_2$ or a mixture of $SiO_2$ and $TiO_2$.

According to at least one embodiment, a radiation-absorbing coating is applied at least in places to at least one outer face of the reflective coating remote from the converter element. Advantageously, electromagnetic residual radiation, which passes through the reflective coating, may be absorbed by the radiation-absorbing coating applied to the outer face of the reflective coating. For example the radiation-absorbing coating is formed with a silicone, an epoxide or a mixture of silicone or epoxide, into which radiation-absorbing materials, for example, carbon black particles or other fillers, have been introduced. The radiation-absorbing coating may then appear black or colored to an external observer.

The invention further relates to a semiconductor device.

According to at least one embodiment, the semiconductor device comprises at least one conversion component, as described in one or more of the embodiments described herein, i.e., the features specified for the conversion component described herein are also disclosed for the semiconductor device described herein.

According to at least one embodiment, the semiconductor device comprises at least one radiation-emitting semiconductor chip with a radiation-outcoupling face, through which at least some of the electromagnetic radiation generated in the semiconductor chip leaves the semiconductor chip. The radiation-emitting semiconductor chip may, for example, comprise a luminescent diode chip. The luminescent diode chip may be a light-emitting diode chip or laser diode chip, which emits radiation in the range of light in the visible or ultraviolet range of the spectrum of electromagnetic radiation.

According to at least one embodiment, the conversion component for conversion of electromagnetic radiation emitted by the semiconductor chip is arranged downstream of the semiconductor chip in its main emission direction at the radiation-outcoupling face. For example, the radiation-outcoupling face and the first major face of the converter element of the conversion component are opposite one another. The conversion component is, for example, applied directly with its first major face to the radiation-outcoupling face of the radiation-emitting semiconductor chip and adhered with the first major face, for example, to the radiation-outcoupling face.

According to at least one embodiment, at least one side face of the semiconductor chip and/or at least one outer face of the reflective coating remote from the semiconductor chip is covered by a further reflective coating. In this case, the further reflective coating may be formed with the same materials as the reflective coating or with different materials. If at least one side face of the semiconductor chip is covered by the reflective coating, electromagnetic radiation exiting from the semiconductor chip and its side face may advantageously also be reflected towards the conversion component and guided thereby. As large as possible a proportion of the electromagnetic radiation generated primarily within the radiation-emitting semiconductor chip is thus advantageously coupled into the converter element of the conversion component and then coupled out of the semiconductor device.

According to at least one embodiment, the reflective coating and the further reflective coating adjoin one another directly, i.e., there is preferably neither a gap nor an interruption between the reflective coating and the further reflective coating. Both the reflective coating and the further reflective coating may be applied, for example, by means of spraying, dispensing, electrophoresis or printing to the respective side faces of the converter element and of the semiconductor chip.

According to at least one embodiment, the semiconductor device comprises at least two radiation-emitting semiconductor chips arranged adjacent one another in the lateral direction, wherein a conversion component is arranged downstream of each semiconductor chip in its main emission direction at the radiation-outcoupling face for the purpose of converting electromagnetic radiation emitted by the semiconductor chip. For example, each semiconductor chip is precisely assigned to one converter element. It is then possible for a converter element to be unambiguously associated with each semiconductor chip. The semiconductor chips are, for example, applied to a surface of a common carrier. "Lateral direction" may in this context mean a direction transverse to the main direction of extension of the carrier. Interspaces are then formed, for example, between respective neighboring semiconductor chips. In other words, the semiconductor chips are then arranged spacedly from one another. In a plan view of the semiconductor component, the interspaces are defined by the side faces of two in each case mutually adjacent semiconductor chips and the surface of the carrier facing the semiconductor chips. If the respective side faces of the converter elements are then covered by the reflective coating, it is advantageously possible to prevent electromagnetic radiation exiting in each case laterally, i.e., via the side faces of the converter element, from impinging on the respective adjacent converter elements and/or semiconductor chips and influencing and/or damaging them, for example, with regard to their physical properties. In other words, the conversion component described herein may make it possible to avoid mutual influencing (or cross talk) of, for example, adjacently arranged converter elements and/or semiconductor chips. Such a semiconductor device may therefore be especially suitable for projectors, as backlighting for display and television screens and for vehicle headlights.

BRIEF DESCRIPTION OF THE DRAWINGS

The conversion component described herein and the semiconductor device described herein are explained in greater detail below with reference to exemplary embodiments and the associated figures.

FIGS. 1A to 1D are schematic views of exemplary embodiments of a conversion component described herein; and FIGS. 2A to 2B show exemplary embodiments of a semiconductor device described herein.

In the exemplary embodiments and figures, identical or identically acting components are in each case provided with the same reference numerals. The elements shown should not be considered as being to scale, but rather individual elements may be shown exaggeratedly large to assist in understanding.

DETAILED DESCRIPTION OF ILLUSTRATIVE EMBODIMENTS

By means of a schematic sectional representation, FIG. 1A shows a conversion component 10 described herein with a converter element 1. The converter element 1 comprises a first major face 11, a second major face 12 opposite the first major face 11 and side faces 13, the major faces 11 and 12 extending parallel to a lateral direction L. The side faces 13 connect the two major faces 11 and 12 together, the side faces 13 extending perpendicular to the lateral direction L, and likewise perpendicular to the two major faces 11 and 12. The converter element 1 may contain at least one luminescence conversion material. The luminescence conversion material at least in part absorbs electromagnetic radiation, coupled into the converter element 1, of one wavelength range and re-emits the absorbed electromagnetic radiation in another wavelength range, independently of direction, i.e., the luminescence conversion material re-emits the converted electromagnetic radiation both in the direction of the two major faces 11 and 12 and in the direction of the side faces 13, without a preferential direction. The converter element 1 is, for example, formed with a ceramic material, into which the luminescence conversion material has been introduced. To this end, the luminescence conversion material may be embedded in a matrix material, for example, a vitreous ceramic or a ceramic. It is likewise possible for the converter element to consist completely of a ceramic luminescence conversion material. The ceramic luminescence conversion material may be in particular YAG:Ce.

A reflective coating 2 completely covers the side faces 13 and reflects back into the converter element 1 electromagnetic radiation exiting from the converter element 1 via the side faces 13. The reflective coating 2 is for example formed with an organic or vitreous base material 22, into which radiation-reflecting particles 23 have been introduced. The radiation-reflecting particles 23 comprise an optical refractive index 232, which is greater than an optical refractive index 222 of the base material. The radiation-reflecting particles 23 are, for example, formed with or contain at least one of the following materials: $TiO_2$, $ZrO_2$, ZnO, $Al_2O_3$, $Ba_5O_4$, MgO, $Ta_2O_5$, $HfO_2$, $Gd_2O_3$, $Nb_2O_3$, $Y_2O_3$. The radiation-reflecting particles comprise, for example, a $d_{50}$ value, measured in $Q_0$, of at least 100 nm to at most 300 nm, for example, 200 nm. Such a size range of the radiation-reflecting particles 23 has proven particularly effective for the reflection of electromagnetic radiation at a wavelength of 500 nm. Furthermore, the radiation-reflecting particles 23 comprise a concentration in the base material 22 of at least 20 wt. %. The reflectivity of the reflective coating 2 may advantageously be individually adjusted as a function of the concentration of the radiation-reflecting particles 23. In the present case, due to the reflection properties, the reflective coating 2 appears white to an external observer, since preferably all of the incident color spectrum is reflected by the reflective coating 2.

The two major faces 11 and 12 of the converter element 1 are completely free of the reflective coating 2, the reflective coating 2 not projecting beyond the converter element 1 at the sides. A thickness D2 of the reflective coating 2 may in particular amount to at least a thickness D1 of the converter element 1.

FIG. 1B is a schematic side view of a further exemplary embodiment of a conversion component 10 described herein.

In contrast to the conversion component 10 shown in FIG. 1A, the reflective coating 2 is formed with a photonic crystal 24, the photonic crystal 24 being formed with a three-dimensional photonic band gap structure. The photonic crystal 24 comprises pores 241, which are filled with air. The photonic crystal 24 is formed with a ceramic material, for example, $TiO_2$ and/or $SiO_2$. The reflective coating 2 described herein comprises particularly high reflectivity. If the photonic crystal 24 is formed for example with $TiO_2$, complete reflection of the electromagnetic radiation impinging on the reflective coating 2 may be achieved in all three spatial directions. In particular, the pores 241 may comprise a diameter, i.e., the maximum distance between two points within a pore 241, of at least 200 nm and at most 300 nm, for example, of 250 nm. Such a pore size of the pores 241 may serve in particular for efficient reflection of electromagnetic radiation at a wavelength of for example 500 nm.

FIG. 1C is a schematic side view of a further exemplary embodiment of a conversion component 10 described herein, wherein in contrast to the conversion components 10 shown in FIGS. 1A and 1B, a radiation-absorbing coating 4 is additionally applied completely to an outer face 41 of the reflective coating 2 remote from the converter element 1. The radiation-absorbing coating 4 is, for example, formed with a matrix material into which radiation-absorbing particles or fibers have been introduced. For example, the radiation-absorbing particles are carbon black particles or particles formed with $Fe_3O_4$. The radiation-absorbing coating 4 may appear black to an external observer. Advantageously, electromagnetic radiation passing through the reflective coating 2 may be absorbed by the radiation-absorbing coating 4. In addition, undesired residual radiation may be prevented from leaving the converter element 1 through the side faces 13.

FIG. 1D is a schematic plan view of a conversion component 10 described herein, for example, according to at least one of the embodiments described in FIGS. 1A to 1C. The figure shows the second major face 12 of the converter element 1 and the reflective coating 2. The reflective coating 2 is applied completely to all six side faces 13. The converter element 1 additionally comprises a recess A1 in a region B1. A bonding wire connection region of the semiconductor chip may be exposed by the recess A1, in the event of the conversion component 10 being applied to a radiation-outcoupling face of a radiation-emitting semiconductor chip.

FIGS. 2A and 2B are schematic side views of exemplary embodiments of a semiconductor device 100 described herein.

FIG. 2A shows a radiation-emitting semiconductor chip 20 with a radiation-outcoupling face 21, through which at least a part of the electromagnetic radiation generated in the semiconductor chip 20 leaves the semiconductor chip 20. An adhesion layer 30 is arranged between the radiation-outcoupling face 21 and the first major face 11 of the converter element 1. The adhesion layer 30 is in direct contact via the radiation-outcoupling face 21 and the first major face 11 both with the converter element 1 and with semiconductor chip 20, such that neither a gap nor an interruption is formed between the adhesion layer 30 on the one hand and the converter element 1 and the semiconductor chip 20 on the other. The adhesion layer 30 allows a mechanically tight bond between the semiconductor chip 20 and the conversion component 10. The adhesion layer 30 is formed with a silicone, for example. The adhesion layer 30 preferably transmits electromagnetic radiation emitted by the semiconductor chip 20. In this case, all the side faces 26 are free of the reflective coating 2.

In FIG. 2B, in contrast to the exemplary embodiment shown in FIG. 2A, a further reflective coating 5 is applied completely to the side faces 26 of the semiconductor chip 20. The further reflective coating 5 and the reflective coating 2 adjoin one another directly. The two coatings 2 and 5 are each formed with the same material or with different materials.

The invention is not restricted by the description given with reference to the exemplary embodiments. Rather, the invention encompasses any novel feature and combination of features, including in particular any combination of features in the claims, even if this feature or this combination is not itself explicitly indicated in the claims or the exemplary embodiments.

The invention claimed is:

1. A conversion component for being arranged downstream at a radiation-outcoupling face of exactly one radiation-emitting semiconductor chip, the conversion component comprising:
    a converter element comprising a first major face, a second major face opposite the first major face and a side face that connects the first and second major faces, the converter element containing a luminescence conversion material that is suitable for absorbing electromagnetic radiation of one wavelength range and re-emitting the absorbed electromagnetic radiation in another wavelength range with larger wavelengths than the absorbed electromagnetic radiation; and
    a reflective coating configured to reflect electromagnetic radiation exiting from the converter element and to reflect the radiation at least in part back into the converter element,
    wherein the reflective coating covers the converter element at least in places at the side face,
    wherein the first and second major faces of the converter element are free at least in places of the reflective coating,
    wherein a radiation-absorbing coating is located at least in places on at least one outer face of the reflective coating remote from the converter element, the radiation-absorbing coating appearing black for an external observer,
    wherein the converter element, the reflective coating and the radiation-absorbing coating are placed directly on top of each other,
    wherein the reflective coating comprises at least one material selected from the group consisting of an organic material and a plastics material,
    wherein the reflective coating has a thickness from at least 50 μm to at most 300 μm, wherein the thickness is measured in a direction perpendicular to the side face of the converter element, and
    wherein the conversion component is self-supporting.

2. The conversion component according to claim 1, wherein the reflective coating does not project beyond the converter element at the side face.

3. The conversion component according to claim 1, wherein the converter element comprises a ceramic material.

4. The conversion component according to claim 1, wherein the reflective coating comprises a base material and radiation-reflecting particles, wherein an optical refractive index of the radiation-reflecting particles is greater than an optical refractive index of the base material.

5. The conversion component according to claim 4, wherein the radiation-reflecting particles are formed with or contain at least one of the following materials: $TiO_2$, $ZrO_2$, $ZnO$, $Al_2O_3$, $BaSO_4$, $MgO$, $Ta_2O_5$, $HfO_2$, $Gd_2O_3$, $Nb_2O_3$, $Y_2O_3$.

6. The conversion component according to claim 4, wherein a concentration of radiation-reflecting particles in the base material amounts to at least 10 vol. %.

7. The conversion component according to claim 1, wherein the reflective coating comprises at least one photonic crystal, and wherein the photonic crystal comprises at least one of a one-, two- and/or three-dimensional photonic band gap structure.

8. The conversion component according to claim 7, wherein the photonic crystal comprises pores, and wherein the photonic crystal comprises a ceramic material and/or a vitreous material.

9. A semiconductor device comprising:
    at least one conversion component according to claim 1; and
    the exactly one radiation-emitting semiconductor chip, having a radiation-outcoupling face through which at least some of the electromagnetic radiation generated in the semiconductor chip leaves the semiconductor chip,
    wherein the conversion component for conversion of electromagnetic radiation emitted by the semiconductor chip is arranged downstream of the semiconductor chip in its main emission direction at the radiation-outcoupling face.

10. The semiconductor device according to claim 9, wherein a side face of the semiconductor chip and/or an outer face of the reflective coating remote from the semiconductor chip is covered by a further reflective coating at least in places.

11. The semiconductor device according to claim 10, wherein the reflective coating and the further reflective coating directly adjoin one another.

12. A conversion component for being arranged downstream at a radiation-outcoupling face of a radiation-emitting semiconductor chip, the conversion component comprising:
    a converter element, comprising a first major face, a second major face opposite the first major face and a side face that connects the first and second major faces, the converter element containing a luminescence conversion material that is suitable for absorbing electromagnetic radiation of one wavelength range and re-emitting the absorbed electromagnetic radiation in another wavelength range with larger wavelengths than the absorbed electromagnetic radiation; and
    a reflective coating configured to reflect electromagnetic radiation exiting from the converter element and to reflect the radiation at least in part back into the converter element,
    wherein the reflective coating covers the converter element at least in places at the side face,
    wherein the first and second major faces of the converter element are free at least in places of the reflective coating, wherein a radiation-absorbing coating is applied at least in places to at least one outer face of the reflective coating remote from the converter element, and
    wherein the reflective coating comprises at least one photonic crystal, wherein the photonic crystal comprises at least one of a one-, two- and/or three-dimensional photonic band gap structure, wherein the photonic crystal comprises pores and wherein the photonic crystal comprises a ceramic material and/or a vitreous material, and wherein the pores have a diameter of at least 200 nm.

* * * * *